United States Patent
Yan et al.

(10) Patent No.: US 8,324,641 B2
(45) Date of Patent: Dec. 4, 2012

(54) MATRIX MATERIAL INCLUDING AN EMBEDDED DISPERSION OF BEADS FOR A LIGHT-EMITTING DEVICE

(75) Inventors: Xiantao Yan, Palo Alto, CA (US); Zequn Mei, Fremont, CA (US)

(73) Assignee: LedEngin, Inc., Grand Cayman (KY)

( * ) Notice: Subject to any disclaimer, the term of this patent is extended or adjusted under 35 U.S.C. 154(b) by 575 days.

(21) Appl. No.: 11/824,233

(22) Filed: Jun. 29, 2007

(65) Prior Publication Data
US 2009/0001390 A1      Jan. 1, 2009

(51) Int. Cl.
*H01L 33/00* (2010.01)

(52) U.S. Cl. ..... 257/98; 257/99; 257/100; 257/E33.059; 257/E33.06

(58) Field of Classification Search .......... 257/88, 257/98–100, E33.056–E33.059, E33.061
See application file for complete search history.

(56) References Cited

U.S. PATENT DOCUMENTS

| | | | |
|---|---|---|---|
| 5,742,120 A | 4/1998 | Lin | |
| 5,959,316 A | 9/1999 | Lowery | |
| 6,307,160 B1 | 10/2001 | Mei et al. | |
| 6,351,069 B1 | 2/2002 | Lowery et al. | |
| 6,608,332 B2 | 8/2003 | Shimizu et al. | |
| 6,610,563 B1 | 8/2003 | Waitl et al. | |
| 6,614,179 B1 | 9/2003 | Shimizu et al. | |
| 6,642,652 B2 | 11/2003 | Collins, III et al. | |
| 6,680,128 B2 | 1/2004 | Mei | |
| 6,791,116 B2 | 9/2004 | Takahashi et al. | |
| 6,828,170 B2 | 12/2004 | Roberts et al. | |
| 7,064,353 B2 | 6/2006 | Bhat | |
| 7,156,538 B2 | 1/2007 | Han et al. | |
| 7,157,744 B2 | 1/2007 | Palmteer et al. | |
| 7,168,608 B2 | 1/2007 | Mei | |
| 7,199,446 B1 | 4/2007 | Mei et al. | |
| 7,264,378 B2 | 9/2007 | Loh | |
| 2001/0015778 A1 | 8/2001 | Murade et al. | |
| 2002/0015013 A1 | 2/2002 | Ragle | |
| 2002/0079837 A1 | 6/2002 | Okazaki | |
| 2002/0163006 A1 | 11/2002 | Yoganandan et al. | |
| 2002/0191885 A1 | 12/2002 | Wu et al. | |
| 2003/0016899 A1 | 1/2003 | Yan | |
| 2003/0086674 A1 | 5/2003 | Yan et al. | |
| 2003/0095399 A1 | 5/2003 | Grenda et al. | |
| 2003/0116769 A1 | 6/2003 | Song et al. | |
| 2003/0122482 A1 * | 7/2003 | Yamanaka et al. | 313/512 |

(Continued)

FOREIGN PATENT DOCUMENTS

JP      H9-321341      12/1997

(Continued)

OTHER PUBLICATIONS

Harper, Charles A. Electronic Materials and Processes Handbook. 2004, The McGraw-Hill Companies. Third Edition. p. 2.39.*

(Continued)

*Primary Examiner* — Benjamin Sandvik
*Assistant Examiner* — Leslie Pilar Cruz
(74) *Attorney, Agent, or Firm* — Carr & Ferrell LLP

(57) ABSTRACT

A light-emitting device has a light source disposed on a support. A matrix material including a dispersion of beads is disposed over the light source. The refractive index of the beads is different from the refractive index of the matrix material. The light source may include an LED. The matrix material may include a lens.

26 Claims, 7 Drawing Sheets

U.S. PATENT DOCUMENTS

| | | | | |
|---|---|---|---|---|
| 2003/0227249 | A1* | 12/2003 | Mueller et al. | 313/491 |
| 2003/0230977 | A1 | 12/2003 | Epstein | |
| 2004/0004437 | A1 | 1/2004 | Shimizu et al. | |
| 2004/0036081 | A1* | 2/2004 | Okazaki | 257/99 |
| 2004/0051111 | A1 | 3/2004 | Ota et al. | |
| 2004/0079957 | A1* | 4/2004 | Andrews et al. | 257/100 |
| 2004/0084687 | A1* | 5/2004 | Hohn et al. | 257/100 |
| 2004/0102061 | A1 | 5/2004 | Watanabe | |
| 2004/0126918 | A1 | 7/2004 | Kurahashi et al. | |
| 2004/0129946 | A1 | 7/2004 | Nagai et al. | |
| 2004/0173810 | A1* | 9/2004 | Lin et al. | 257/100 |
| 2004/0188697 | A1* | 9/2004 | Brunner et al. | 257/100 |
| 2004/0201025 | A1 | 10/2004 | Barnett et al. | |
| 2004/0207998 | A1* | 10/2004 | Suehiro et al. | 362/84 |
| 2004/0257496 | A1 | 12/2004 | Sonoda et al. | |
| 2005/0035364 | A1 | 2/2005 | Sano et al. | |
| 2005/0093116 | A1 | 5/2005 | Palmteer et al. | |
| 2005/0093146 | A1 | 5/2005 | Sakano | |
| 2005/0145872 | A1 | 7/2005 | Fang et al. | |
| 2005/0179376 | A1 | 8/2005 | Fung et al. | |
| 2005/0199900 | A1 | 9/2005 | Lin et al. | |
| 2005/0221519 | A1* | 10/2005 | Leung et al. | 438/27 |
| 2005/0224829 | A1* | 10/2005 | Negley et al. | 257/99 |
| 2005/0224830 | A1 | 10/2005 | Blonder et al. | |
| 2005/0253242 | A1 | 11/2005 | Costello et al. | |
| 2005/0270666 | A1 | 12/2005 | Loh et al. | |
| 2005/0286131 | A1 | 12/2005 | Saxena et al. | |
| 2006/0012299 | A1 | 1/2006 | Suehiro et al. | |
| 2006/0063287 | A1 | 3/2006 | Andrews | |
| 2006/0082296 | A1 | 4/2006 | Chua et al. | |
| 2006/0082679 | A1 | 4/2006 | Chua et al. | |
| 2006/0097385 | A1 | 5/2006 | Negley | |
| 2006/0102914 | A1 | 5/2006 | Smits et al. | |
| 2006/0105484 | A1 | 5/2006 | Basin et al. | |
| 2006/0105485 | A1 | 5/2006 | Basin et al. | |
| 2006/0170332 | A1 | 8/2006 | Tamaki et al. | |
| 2006/0284209 | A1 | 12/2006 | Kim et al. | |
| 2006/0289050 | A1* | 12/2006 | Alley et al. | 136/203 |
| 2007/0090375 | A1* | 4/2007 | Kobilke | 257/89 |
| 2007/0152212 | A1* | 7/2007 | Cho et al. | 257/40 |
| 2007/0194341 | A1* | 8/2007 | Chang et al. | 257/99 |
| 2007/0215893 | A1* | 9/2007 | Liao et al. | 257/98 |
| 2007/0228390 | A1* | 10/2007 | Hattori et al. | 257/79 |
| 2007/0278512 | A1 | 12/2007 | Loh et al. | |
| 2008/0012036 | A1 | 1/2008 | Loh | |
| 2008/0048200 | A1* | 2/2008 | Mueller et al. | 257/98 |
| 2008/0308825 | A1* | 12/2008 | Chakraborty et al. | 257/98 |

FOREIGN PATENT DOCUMENTS

| | | |
|---|---|---|
| JP | H11-298035 | 10/1999 |
| JP | 2000-349346 | 12/2000 |
| JP | 2000-349347 | 12/2000 |
| JP | 2001-057445 | 2/2001 |
| JP | 2001-168398 | 6/2001 |
| JP | 2002185046 | 6/2002 |
| JP | 2004-031508 | 1/2004 |
| JP | 2004-111937 | 4/2004 |
| JP | 2004241704 | 8/2004 |
| JP | 2004-253404 | 9/2004 |
| JP | 2004-259958 | 9/2004 |
| JP | 2004-266246 | 9/2004 |
| JP | 2004-274087 | 9/2004 |
| JP | 2004-282004 | 10/2004 |

OTHER PUBLICATIONS

Official Action for Japanese patent application No. 2005-315149, Japan Patent Office, Jul. 21, 2009, pp. 1-3, 1-2.

"Solvent Soluble Polyimide with High Transparency and high Tg: HOP-400, 500", Hitachi Cable Review, Aug. 2003, No. 22, p. 78.

Kading, O.W., Thermal conduction in metallized silicon-dioxide layers on silicon, Appl. Phys. Lett 65, 1994.

Yan, Xiantao, Two Test Specimens for Determining the Interfacial Fracture Toughness in Flip-Chip Assemblies, Transactions of the ASME, vol. 120, Jun. 1998, p. 150.

Yan, Xiantao, Analysis Based Design Guidelines for Metal Runner and Passivation Layers in IC Packaging, Delphi Automotive Systems Analytical Engineering Conference, May 2000, p. 1.

* cited by examiner

MATRIX MATERIAL INCLUDING AN EMBEDDED DISPERSION OF BEADS FOR A LIGHT-EMITTING DEVICE

BACKGROUND OF THE INVENTION

1. Field of the Invention

The present disclosure relates generally to light-emitting devices and more particularly to packages for uniformly dispersing light from light-emitting diodes.

2. Description of the Prior Art

A light-emitting device includes a light source and a package for supporting. the light source and directing, focusing, filtering, or enhancing light emitted from the light source. Some examples of light sources include a light-emitting diode (LED), an incandescent lamp, a sapphire crystal light, and a fluorescent lamp.

An LED is a semiconductor device that emits incoherent narrow-spectrum light when electrically biased in the forward direction of the p-n junction. This effect is a form of electroluminescence. The color of the emitted light depends on the composition and condition of the semiconducting material used, and can be infrared, visible or near-ultraviolet. Advantages of LEDs over other lighting sources include compactness, very low weight, low power consumption, simple and inexpensive manufacturing, freedom from burn-out problems, high vibration resistance, and an ability to endure frequent repetitive operations. In addition to having widespread applications for electronic products such as indicator lights and so forth, LEDs also have become an important alternative light source for various applications where incandescent and fluorescent lamps have traditionally predominated.

While LEDs are generally monochromatic, LEDs can also be used produce white light, for example, using phosphors as light "converters." In a typical LED-based white light producing device, an LED that produces a monochromatic visible light is encapsulated in a material containing a compensatory phosphor. The wavelength of the light emitted from the compensatory phosphor is complementary to the wavelength of the light emitted by the LED such that the wavelengths from the LED and the compensatory phosphor mix together to produce white light. For instance, a blue LED-based white light source produces white light by using a blue monochromatic LED and a phosphor that emits a complementary yellow hue when excited by the blue light. In these devices the amount of the phosphor in the encapsulant is carefully controlled such that a fraction of the blue light is absorbed by the phosphor while the remainder passes unabsorbed. The complementary yellow hue of the light emitted by the phosphor and the unabsorbed blue light mix to produce white light.

In another typical LED-based white light producing device, multiple monochromatic LED elements are encapsulated in a transparent material. For example, a red LED element, two green LED elements and a blue LED element can form a red-green-green-blue (RGGB) LED light source. Current can be applied independently to each of the LED elements to adjust the color balance. Thus, a white light can be produced.

Unfortunately, the color balance of the white light can vary depending on an angle from which the light is viewed, which results in a non-uniform color distribution. Attempts have been made using special-mixing lenses to compensate for the non-uniformity of the color distribution. However, while the variation may be reduced, the color still varies noticeably depending on the angle of the emitted illumination, or the angle from which the illumination is received or viewed. Such color non-uniformity can negatively affect designs for light sources such as spot lights and other general lighting applications, and color display technologies such as active matrix thin film transistor liquid crystal displays (TFTLCDs) in applications such as consumer computer and television monitors, projection TVs, large advertising displays. One solution to the problem of color variation is to use a secondary lens with a light mixing design on the light emitting device. Unfortunately, the secondary lens generally causes a 40% to 50% reduction in light intensity output by the light emitting device.

The quality of color, also known as color rendition, is also very important in many applications. For example, medical personnel rely on color for identifying tissues during surgery. One measure of color rendition is the ability of a light source to reproduce the colors of various objects being lit by the source, which can be quantified by a color rendering index (CRI). The best possible rendition of colors is specified by a CRI of 100, while the poorest rendition is specified by a CRI of 0. In applications such as surgery, a CRI of less than 70 results in a drop out of many colors and provides poor illumination, making tissue identification difficult. Typically, a CRI of greater than 80-90 is preferred for medical applications. The CRI of an incandescent light bulb, which emits essentially black body radiation, is nearly one hundred. However, an incandescent lamp also produces a lot of heat. What is needed is a cool light source with a CRI greater than 80-90. While a white light LED source can be adjusted to emit light having a high CRI in one particular direction, what is needed is an LED source that can emit white light having a high CRI uniformly over a wide range of angles.

Given the importance of LEDs as light sources, particularly LEDs using multiple color elements, there is a need for improved LED packaging methods and materials to alleviate the above-identified problems. There is a further need for methods and materials that can also reduce light lost at large angles and allow LEDs to produce higher optical performance (Lumens/package) from a smaller package or footprint (Lumens/area), which are critical for many light source applications.

SUMMARY

The present disclosure addresses the above problems by providing methods for forming LED packages and light-emitting devices. According to an embodiment of the invention, a light-emitting device comprises a support, a light source disposed on the support, a matrix material having a first refractive index disposed over the light source. The matrix material includes a dispersion of beads where the beads have a second refractive index different than the first refractive index.

According to another embodiment of the invention, a method is provided for mixing light from two light sources to provide a uniform colored light over a range of angles. The method comprises emitting light from two light sources disposed on a support each light source emitting a different colored light, and transmitting the light from the, two light sources through a matrix material having a first refractive index and including beads having a second refractive index dispersed within the matrix material. In some embodiments, the matrix material includes a first glass and the bead material includes a second glass having a higher refractive index and a higher melting point than the first glass. The beads can be less than ten microns in diameter and less that twenty percent of the matrix material by weight.

DETAILED DESCRIPTION

The present disclosure provides light-emitting devices that include a transparent matrix material encapsulating a light source. The light-emitting devices of the present invention can employ incandescent, sapphire crystal, fluorescent, or LED light sources that operate over the range of wavelengths from ultraviolet (UV) to Infrared (IR) which covers the range from about 200 to 2000 nanometers.

In one example, a light-emitting device includes a plurality of monochromatic LED elements configured to emit light of a plurality of colors. The transparent matrix material includes a dispersion of beads configured to scatter the light emitted by the LED elements as the light traverses the matrix material. The beads provide a uniform mixing of the emitted light such that the colors combined from the individual LEDs appear as a constant color over a range of angles.

In another example, a light-emitting device includes a matrix material and an LED configured to emit a monochromatic light, for example a blue light. The matrix material includes a phosphor configured to absorb a fraction of the blue light and produce a light having a complementary yellow hue, while the remainder of the blue light passes unabsorbed. The complementary yellow hue of the light emitted by the phosphor and the unabsorbed blue light combine to produce white light. The matrix material further includes a dispersion of beads configured to scatter and mix the blue and complementary yellow lights and provide a uniform white light.

A further benefit of using the dispersion of beads is an improved efficiency of the light emission from the light-emitting device. An amount of light emitted from an LED or another light source using the matrix material including the beads is greater than from a similar light-emitting device using a secondary lens with a mixing feature. Improved transmission efficiency also allows for smaller packages to emit as much light as larger inefficient packages, and at lower temperatures. An improved CRI over a wide range of angles is another benefit of including the dispersion of beads in the matrix material.

Accordingly, exemplary light-emitting devices according to the present disclosure may have one or more of the following features: 1) They provide a wide range of angles over which the light-emitting device can provide uniform color and intensity illumination; 2) they offer higher performance by enabling 30% or greater luminosity per LED die as compared to the luminosity of a light emitting device using a secondary lens with a light mixing design; and 3) they provide a uniform CRI over a wide range of angles. In the case of white LED applications, the present disclosure provides embodiments for improving white light LED efficiency. Therefore, the present invention enables a new class of uniform color controlled LED-based light sources and display applications.

Figure 1:
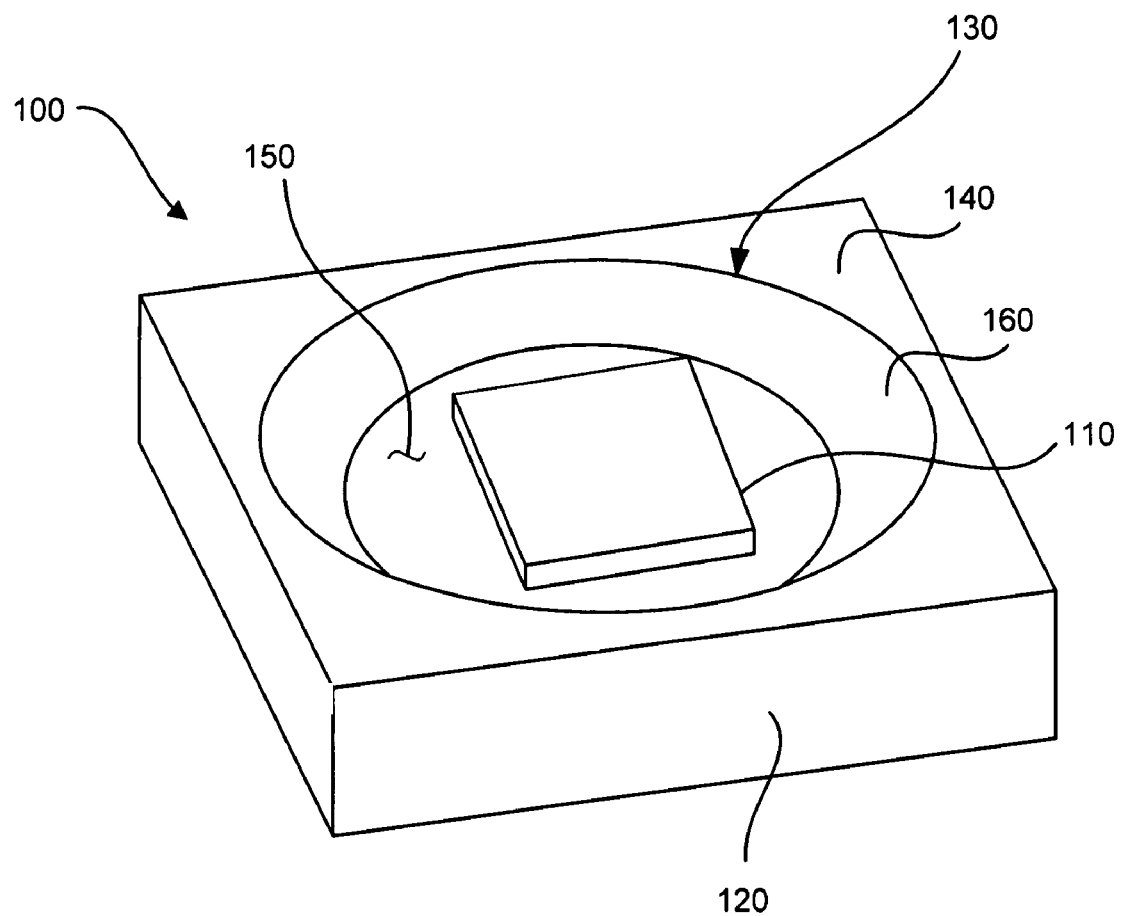
FIG. 1 is a perspective view of an exemplary light-emitting device according to an embodiment of the present disclosure.

FIG. 1 is a perspective view of an exemplary light-emitting device 100 according to an embodiment of the present disclosure. In various embodiments, a light source 110 includes a light-emitting diode (LED), a die including multiple LED elements, a sapphire crystal, a filament light source, and so forth. The light-emitting device 100 comprises a body 120 configured to provide a support for the light source 110. In this embodiment, the body 120 includes a cavity 130 extending downward from a top surface 140 of the body 120. The cavity 130 includes a floor 150 configured for bonding to the light source 110. The light-emitting device 100 further includes a matrix material (discussed below) disposed within the cavity 130. The matrix material encapsulates the light source 110. In some embodiments, the light-emitting device 100 has a square footprint enabling multiple light-emitting devices 100 to be densely arranged in a square array.

In the embodiment shown in FIG. 1, a sidewall 160 of the cavity 130 is inclined at an angle so that the cavity 130 takes the shape of an inverted and truncated cone. The sidewall 160 can also be vertical, or nearly so. In some embodiments the sidewall 160 of the cavity 130 is inclined at a 45° angle. In other embodiments the sidewall 160 takes a parabolic shape and may be coated with a reflective material to redirect and/or focus the light.

Figure 2:
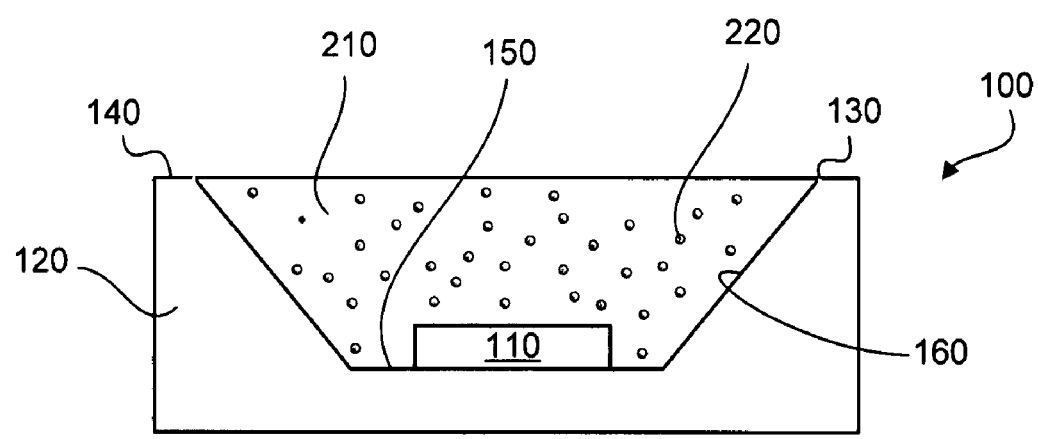
FIG. 2 is a cross-sectional view of the light-emitting device of FIG. 1.
Figure 3:
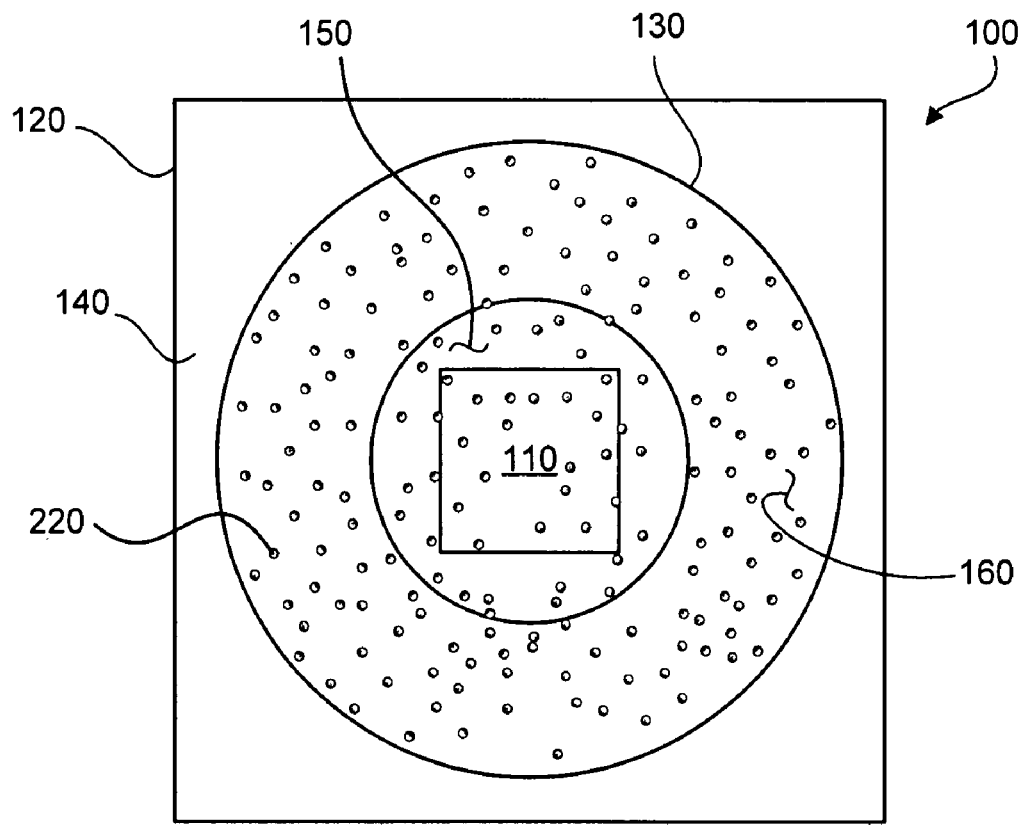
FIG. 3 is a top plan view of the light-emitting device of FIG. 1.

FIG. 2 is a cross-sectional view of the light-emitting device 100 of FIG. 1, and FIG. 3 is a top plan view of the light-emitting device 100 of FIG. 1. The light-emitting device 100 further includes a matrix material 210 disposed with in the cavity 130. The matrix material 210 includes a dispersion of beads 220. In various embodiments, the matrix material 210 include a transparent material, for example, glass, silicone, polymer, epoxy, or plastic. The beads 220 are configured to mix light from the light source 10 and to diffuse transmission of the light through the matrix material 210.

In various embodiments, the beads 220 include a transparent material, for example, glass, silicone, polymer, epoxy, or plastic. A refractive index for the beads 220 is different from a refractive index for the matrix material 210. Generally, the refractive index for the beads 220 is higher than the refractive index for the matrix material 210. In some embodiments, the range for the refractive index of the matrix material 210 includes about 1.40-1.85. Typically the refractive index for the matrix material 210 is in a range of about 1.40-1.60. In some embodiments, the range of the refractive index of the beads 220 includes about 1.40-1.89. Typically the refractive index of the beads 220 is in a range of about 1.44-1.65.

In some embodiments, the matrix material 210 includes a phosphor configured to absorb light at a first wavelength and emit light at a second wavelength. For example, the matrix material may absorb a portion of blue light emitted by the light source 110 and emit light having a complementary yellow hue at a wavelength in the yellow region of the visible light spectrum. The combination of the blue and complementary yellow hue can be adjusted to emit a desired color from the light-emitting device 100. The beads 220 are configured to mix the first wavelength of light from the light source 110 with the second wavelength of light emitted from the matrix material to provide a uniform output of the desired color.

In some embodiments, an amount of beads 220 dispersed within the matrix material 210 is greater than about 1 percent and less than about 80 percent by weight. Typically, the amount of beads 220 dispersed within the matrix material 210 includes a range of about 2 percent to about 10 percent by weight. In some embodiments, a size of the beads 220 includes a range of about 0.3 microns to about 20 microns. Typically, the size of the beads 220 includes a range of about 0.5 microns to about 10 microns. Generally, the beads are dispersed uniformly in the matrix material. In some embodiments, a high speed mixer can be used to disperse the beads uniformly within the matrix material.

In some embodiments, beads 220 comprising a glass having a first refractive index can be dispersed into the matrix material 210 comprising a glass having a second refractive index. A melting point for the glass of the beads 220 that is higher than a melting point for the glass of the matrix material 210 facilitates mixing the beads 220 into the glass of matrix material 210.

Figure 4:
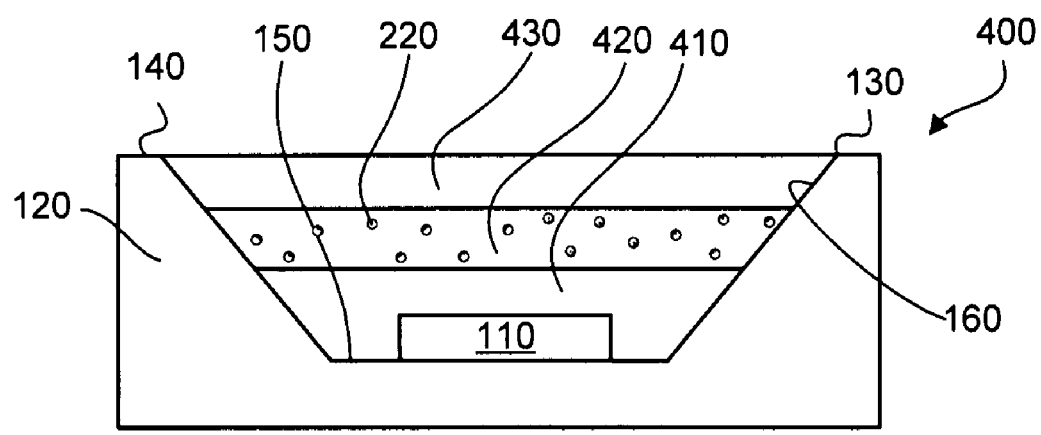
FIG. 4 is a cross-sectional view of a light-emitting device which is an alternate embodiment of the light-emitting device of FIG. 1, illustrating multiple layers of matrix materials.

FIG. 4 is a cross-sectional view of a light-emitting device 400 which is an alternate embodiment of the light-emitting device 100 of FIG. 1, illustrating multiple layers 410, 420, 430 of matrix materials. The light-emitting device 400 can include more layers or fewer layers than the three layers 410, 420, and 430 illustrated in FIG. 4. In some embodiments, the layer 410 includes a thermal insulation matrix material to form a thermal barrier. Examples of the layer 420 include a luminescent matrix material. Examples of the layer 430 include an auxiliary matrix material configured to enclose the cavity 130 from the top.

In some embodiments, one or more layers of the light-emitting device 400 can function as a refractive index matching layer. For example, the refractive index of the layers 410, 420, and 430 can progressively decrease such that the refractive index for the layer 410 is higher than the refractive index for the layer 420, which in turn is higher than the refractive index of the layer 430, which in turn is higher than the refractive index of the exterior (e.g., air). Thus, the layers 410, 420, and 430 may provide refractive index matching between the light source 110 and the exterior of the light-emitting device 400. For example, the light-emitting device 400 can use a light source 110 having refractive index of 1.6 and emit light into air which has a refractive index of about 1.0. The layers 410, 420, and 430 can have refractive indexes of 1.55, 1.50 and 1.45 respectively. A person of ordinary skill in the art will appreciate that a refractive index matching layer can reduce total internal reflection and increase emission from the layer by increasing the critical angle, as determined by Snell's law. Accordingly, the efficiency of the light-emitting device 400 increases as the difference in refractive indexes between layers decrease and the critical angles increase.

In some embodiments, the thermal insulation matrix material in the layer 410 at least partially protects the luminescent matrix material in the layer 420 from the heat produced by the light source 110 to better maintaining thermal properties, such as light conversion efficiency and output wavelength, at or near optimal values. The thermal insulating matrix material of layer 410 can also be a material having a refractive index chosen to closely match that of the material of the light source 110. Layer 410 is therefore referred to herein as a thermal insulating and/or a refractive index matching layer. The thermal insulating material may be transparent, or nearly so, to the light emitted from the LED. The wavelengths emitted by various available LEDs extend over a wide spectrum, including both visible and invisible light, depending on the type of LED. The thermal insulating material can comprise polymers, ceramics, glasses, mixtures thereof, as well as other suitable materials. The thermal insulating material may have a thermal conductivity below 0.5 watts/meter-Kelvin, preferably below 0.15 watts/meter-Kelvin. The thermal insulating material may have a glass transition above 170 degrees Celsius, preferably above 250 degrees Celsius. The thermal insulating material may have a thermal expansion coefficient below 100 ppm/degree Celsius, preferably below 30 ppm/degree Celsius. The thermal insulating material may have a refractive index greater than 1.6, greater than 1.8, and preferably greater than 2.0. In some embodiments, the thermal insulating material has a refractive index in a range of 1.5-2.1, including 1.65-1.84. Particular examples are the high-optical-quality polyimide materials supplied by Brewer Science, Inc. and Hitachi Chemical Co., Ltd. Among these commercially available high transparency polyimide materials, OptiNDEX B38 (Brewer Science) and PIQ 2200 (Hitachi Chemical) can be used as the thermal insulating material in this invention. OptiNDEX B38 and PIQ 2200 are curable liquids that can form a suitable film. Further information regarding thermal insulating materials that can be used in the present disclosure is described in the U.S. patent application Ser. No. 11/036,559, filed on Jan. 13, 2005 entitled "Light Emitting Device with a Thermal Insulating and Refractive Index Matching Material," which is incorporated by reference herein.

While some prior art light-emitting devices have sought to dissipate as much heat as possible through the phosphor-containing layers (e.g., luminescent matrix material in the layer 420), the body 120 can be configured to provide sufficient heat conduction such that it is not necessary to conduct heat through the phosphor-containing luminescent matrix materials in the layer 420. Thus, thermal insulation can be introduced into the layer 410 to shield the luminescent matrix materials in the layer 420 from thermal effects. For example, the package of the present disclosure can further use thermal techniques as described in the U.S. patent application Ser. No. 11/260,101, filed on Oct. 26, 2005 entitled "Method of Manufacturing Ceramic LED Packages," which is incorporated by reference herein. In some embodiments, the light source is bonded to a thermal conduction layer, which may optionally be attached to a heat sink. A thermal conduction layer may include a thermally conductive material, which preferably has a thermal conductivity greater than 14 watts/meter Kelvin, and preferably greater than 150 watts/meter-Kelvin. Thermally conducting materials may include AlN, Al2O3, Alloy 42, Cu, Cu—W, Al—Si—C, diamond, graphite, and BeO. Bonding may include using a thermally conductive die attach layer, which may include a thermally conductive epoxy, an electrically conductive epoxy, or a nano-carbon-fiber filled adhesive. A die attach layer may have a conductivity greater than 0.5 watts/meter-Kelvin, preferably greater than about 50 watts/meter-Kelvin.

The matrix material in the layer 420 can include luminescent materials. Luminescent materials suitable for the present invention include both fluorescent materials (phosphors) and phosphorescent materials. Layer 420 is referred to herein as a phosphor layer when the matrix material includes a fluorescent material. Phosphors are particularly useful for LED-based white light sources. Common phosphors for these purposes include Yttrium Aluminum Garnet (YAG) materials, Terbium Aluminum Garnet (TAG) materials, ZnSeS+ materials, Silicon Aluminum Oxynitride (SiAlON) materials, silicate-based phosphor materials, and nitride-based phosphor materials including nitridosilicates such as $Sr_2Si_5N_8:Eu^{2+}$ (a red phosphor) and $SrSi_2O_2N_2:Eu^{2+}$ (a green phosphor). The matrix material in the layer 420 can include, for example, glass, silicone, polymer, epoxy, and plastic.

The matrix material in the layer 430 can serve as a protective or capping layer configured to enclose the cavity 130 from the top. Examples of the matrix material in the layer 430 include a protective layer, an adhesive layer, and a lens. The matrix material in the layer 430 can include, for example, glass, silicone, polymer, epoxy, and plastic. Suitable adhesives are described in U.S. patent application Ser. No. 11/796, 240, filed on Apr. 27, 2007 entitled "LED Packages with Mushroom Shaped Lenses and Methods of Manufacturing LED Light-Emitting Devices," which is incorporated by reference herein. In some embodiments, the matrix material in the layer 430 forms an adhesive layer configured to attach a lens to the body 120. Alternatively, matrix material in the layer 430 includes an optical lens, for example a Fresnel lens, for focusing the light emitted from the light-emitting device 400. The matrix material in the layer 420 is preferably transparent to a broad range of wavelengths emitted from the layer 420.

FIG. 4 shows a dispersion of beads 220 within the matrix material of the layer 420. It will be understood, however, that the matrix materials in the layers 410, 420 or 430 can include a dispersion of beads 220. In various embodiments, the beads 220 dispersed in the layer 410, 420, or 430 include, for example, glass, silicone, polymer, epoxy, and plastic. As discussed above, the refractive index for the beads 220 is different from the refractive index for the matrix material of the respective layers 410, 420, 430. Generally, the refractive index for the beads 220 is higher than the refractive index for the matrix material of the respective layers 410, 420, 430. In some embodiments, the range for the refractive index of the beads includes about 1.40-1.89. Typically the refractive index for the beads 220 is in the range of about 1.40-1.60. It may be appreciated by a person of ordinary skill in the art that each of the layers 410, 420, and 430 can include a dispersion of beads 220 that has the same or different refractive index as beads 220 in other layers.

As discussed above, the amount of beads 220 dispersed within the matrix material of the layers 410, 420, or 430 is typically greater than about 2 percent and less than about 20 percent by weight. However, the amount of beads dispersed within the matrix material of the layers 410, 420, and/or 430 can be in the range of about 1 percent to about 30 percent by weight. It may be appreciated by a person of ordinary skill in the art that each of the layers 410, 420, 430 can include an amount of beads 220 that is the same as, or differs from, an amount of beads 220 in another layer.

As discussed above, the size of the beads 220 includes the range of about 0.3 microns to about 20 microns. In some embodiments, the size of the beads 220 includes the range of about 0.5 microns to about 10 microns. It may be appreciated by a person of ordinary skill in the art that each of the layers 410, 420, and 430 can include a size of beads 220 that is the same as or differs from a size of beads 220 in other layers.

In some embodiments, the beads 220 comprise a glass having a first refractive index and are dispersed into matrix material in the layer 410, 420, or 430 comprising a glass having a second refractive index. A melting point for the glass of the beads 220 is higher than a melting point for the glass of the respective matrix material to facilitate mixing the beads 220 into the glass of the respective matrix material.

In some embodiments, the size and amount of beads 220 can be selected to control a coefficient of thermal expansion (CTE). For example, the layer 410 generally encapsulates and is subjected to heat generated by the light source 110. Moreover, as discussed above the layer 410 can provide a thermal barrier for the layer 420. The beads 220 dispersed in the matrix material in the layer 410 can be selected to reduce the CTE and enhance the thermal barrier. For example, glass beads dispersed into an epoxy matrix material can reduce the CTE of the epoxy.

Figure 5:
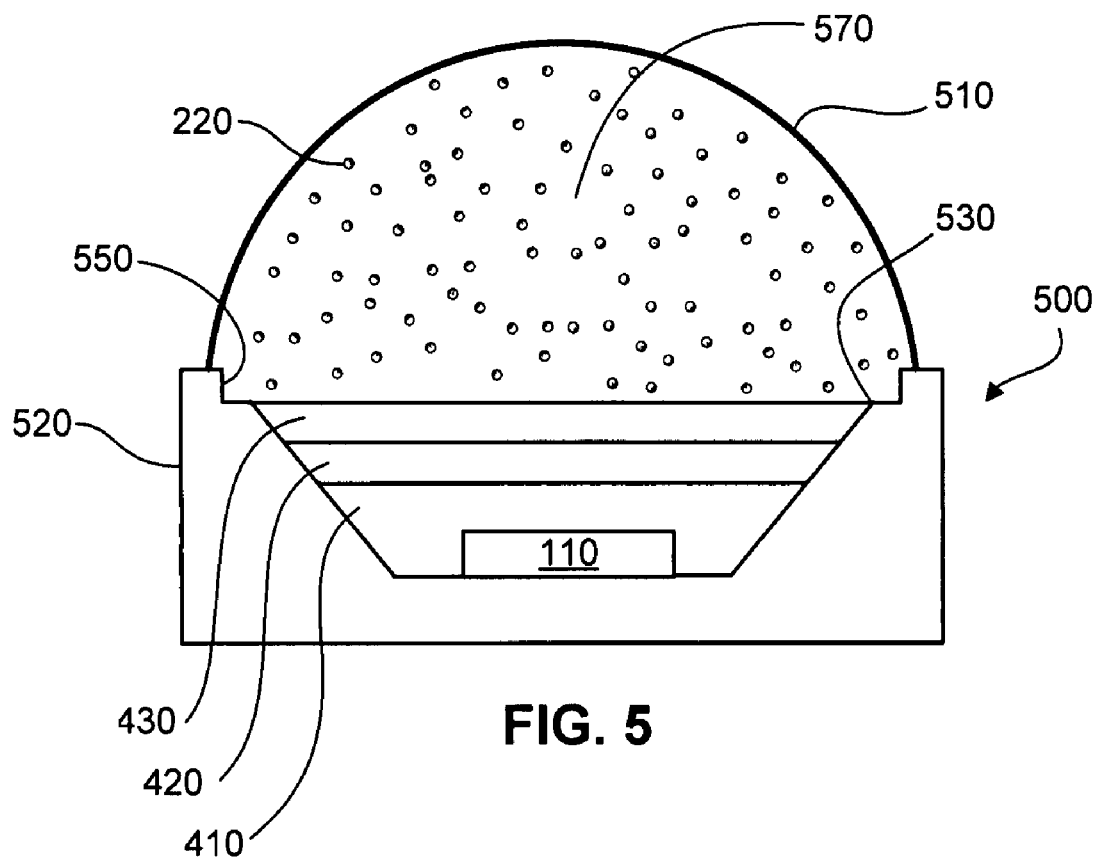
FIG. 5 is a cross-sectional view illustrating a lens on an exemplary light-emitting device according to an embodiment of the present disclosure.

FIG. 5 is a cross-sectional view illustrating a lens 510 on an exemplary light-emitting device 500 according to an embodiment of the present disclosure. The light-emitting device 500 includes a body 520 configured to attach to the lens 510. The body 520 includes a cavity 530, and a circular socket 550. The lens 510 includes a matrix material 570 and beads 220 dispersed in the matrix material 570, and is configured to be inserted into the socket 550. The socket 550 is configured to receive the lens 510 and beneficially provides a guide to center the lens 510 over the light source 110 during assembly. The layer 430 can include an adhesive which forms an adhesive layer configured to secure the lens 510. In some embodiments the lens 510 may be formed in place in the socket 550. See for example, U.S. patent application Ser. No. 11/796,240.

One method of placing a lens 510 on the light-emitting device 500 includes depositing a matrix material 570 comprising a liquid silicone onto the surface of the layer 430. The viscosity and surface tension of the silicone can control the height and a tendency of the silicone to flow across the surface of the layer 430. Moreover, a coating on the surface of the layer 430 can further control the flow of the silicone across the surface of the layer 430. For example, a coating on a perimeter region of the layer 430 can interact with the surface tension of the silicone to prevent flow of the silicone into the perimeter region where the coating has been deposited. Moreover, the coating can be deposited according a pattern configured to produce a desired shape for the lens 510. Alternatively, another type of coating can enhance the flow of the silicone across the coating into the perimeter region.

The matrix material 570 of the lens 510 can include any of the matrix materials used for the layers 210, 410, 420, and 430. Likewise, the proportions, materials, and properties of the beads 220 dispersed in the matrix material 570 can include any of the proportions, materials, and properties of the beads 220 dispersed in the matrix materials of the layers 210, 410, 420, and 430. FIG. 5 shows a dispersion of beads 220 within the matrix material 570 of the lens 510. It will be understood, however, that any or all of the matrix materials in the layers 410, 420, 430, and lens 510 can include a dispersion of beads 220. For example, all three layers 410, 420, 430, and the lens 510 can include silicone matrix material and glass beads. In some embodiments, refractive index matching between the light source 110 and the exterior of the light-emitting device 100 can be provided using, for example, a refractive index of 1.55, 1.50, 1.45, and 1.40 for the layers 410, 420, 430, and the lens 510 respectively.

Figure 6:
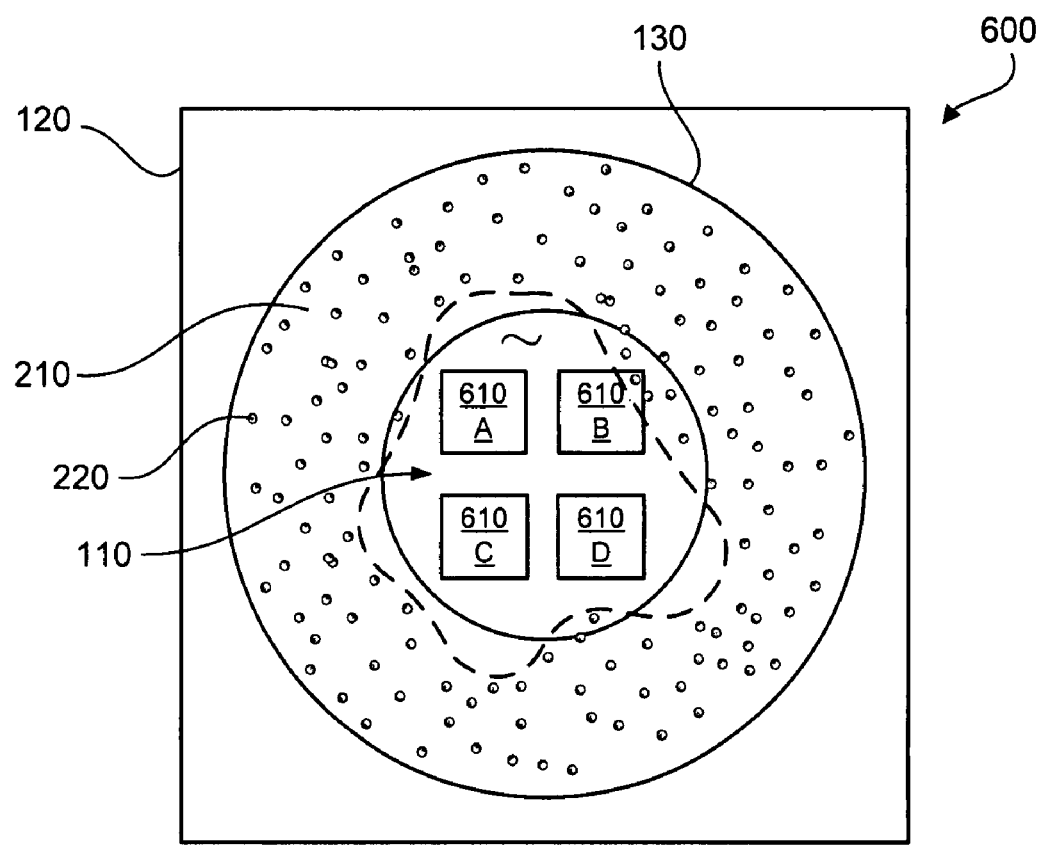
FIG. 6 is a top plan view of a light-emitting device illustrating multiple light source elements in accordance with another embodiment of the present disclosure.

FIG. 6 is a top plan view of a light-emitting device 100 illustrating multiple light source elements 610A, 610B, 610C, and 610D in accordance with another embodiment of the present disclosure. The light-emitting device 600 includes a matrix material 210 disposed in the cavity 130 and beads 220 dispersed in the matrix material 210. For clarity, the beads 220 and the matrix material 210 are omitted from a cutaway region bounded by a dotted line in the illustration. In some embodiments, the light source elements 610A, 610B, 610C, and 610D include monochromatic LEDs. For example, in configuring an "RGGB" light source 110, the light source element 610A can be a monochromatic red LED, 610B and 610C can be monochromatic green LEDs, and 610D can be a monochromatic blue LED.

Although in principle any number of light source elements may be disposed in the light-emitting device 600 of the present invention, four light source elements 610A, 610B, 610C, and 610D comprising LEDs are illustrated. The four LED light source elements 610A, 610B, 610C, and 610D can be the same or different, and in some embodiments are independently operable. In some embodiments, the multiple LED light source elements 610A, 610B, 610C and 610D are selectively operable and can be operable in any combination. For example, the current to the respective light source elements 610A, 610B, 610C and 610D can be independently adjusted to provide a desired color, including white.

Figure 7:
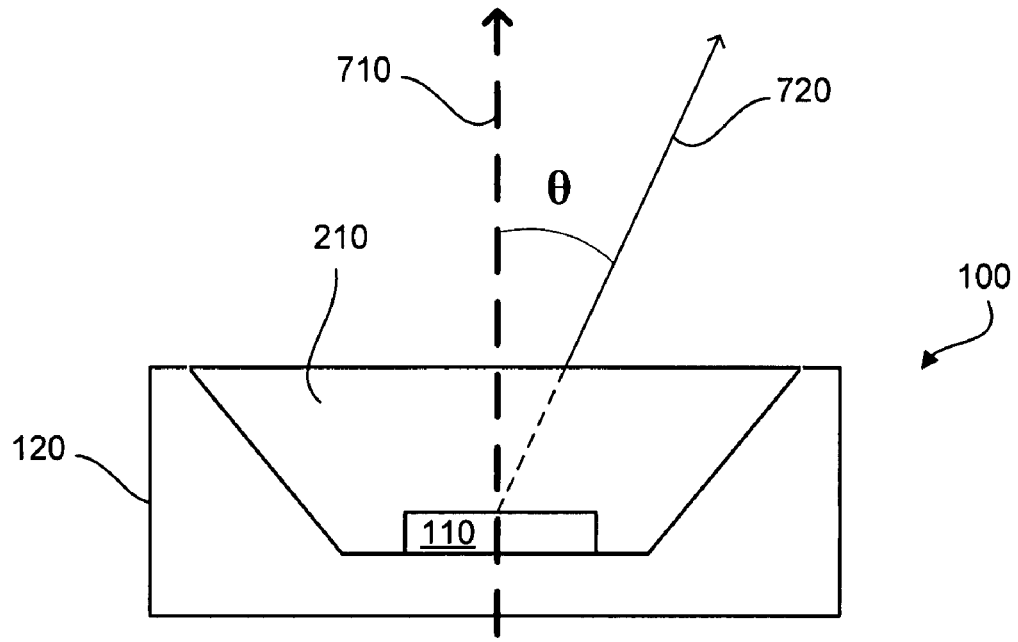
FIG. 7 shows a cross section ray diagram of light emitted from a light-emitting device.

FIG. 7 shows a cross section ray diagram of light emitted from a light-emitting device 100. A line representing a normal 710 is constructed through a center of the light-emitting device 100. However, the normal 710 can be placed anywhere in the light-emitting device 100. A ray 720 illustrates light emerging from the surface of the matrix material 210 of light-emitting device 100 at an emission angle $\theta$ with respect to the normal 710. The ray 720 emerging from the matrix material 210 as shown is extended through the matrix material 210 to intersect the normal 710. However, a person of ordinary skill in the art will appreciate that rays of light from the light source 110 may undergo multiple scattering before emerging from the matrix material 210 along a trajectory, parallel to the ray 720. The emission angle $\theta$ can span a range of angles. In some embodiments, the emission angle $\theta$ includes a range of −90 degrees to +90 degrees.

Figure 8:
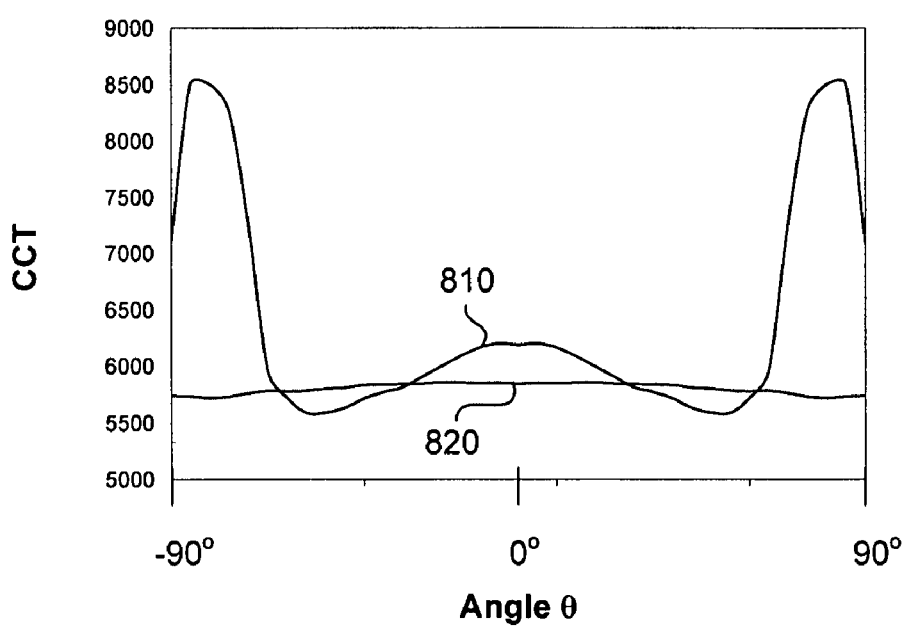
FIG. 8 is a graph illustrating a correlated color temperature (CCT) of the light emitted from the light-emitting device of FIG. 7 as a function of an emission angle θ.

FIG. 8 is a graph illustrating a correlated color temperature (CCT) of the light emitted from the light-emitting device 100 of FIG. 7 as a function of an emission angle $\theta$. The vertical axis represents the CCT and the horizontal axis represents the emission angle $\theta$ for the emitted light. The horizontal axis in FIG. 8 illustrates a range of emission angles $\theta$ of −90 degrees to +90 degrees. The line 810 illustrates a CCT as a-function of the emission angle $\theta$ for light-emitted from a light-emitting device according to the prior art. The CCT of the line 810 varies substantially as a function of the emission angle $\theta$ and the variation is generally visible as a perceptible color difference when observing prior art light-emitting device at various emission angles $\theta$. For example, light from the prior art light-emitting device appears red from some angles $\theta$ and blue from other angles $\theta$, while from directly above the device ($\theta$=0) the light may appear white. Shadows cast by the prior art light-emitting device without beads can have color variations at the edges of the shadows.

The line 820 illustrates the CCT as a function of the emission angle $\theta$ for a light-emitting device 100 using beads 220 (not illustrated in FIG. 7) dispersed in the matrix material 210. The CCT is substantially constant as a function of the emission angle $\theta$. Variations in the color are not perceptible at various emission angles $\theta$ about the light-emitting device 100. For example, the light emitted from the light-emitting device 100 appears white when viewed from various different angles, including directly above ($\theta$=0). Shadows cast by the light-emitting device 100 typically have no perceptible color variation at the edges.

Figure 9:
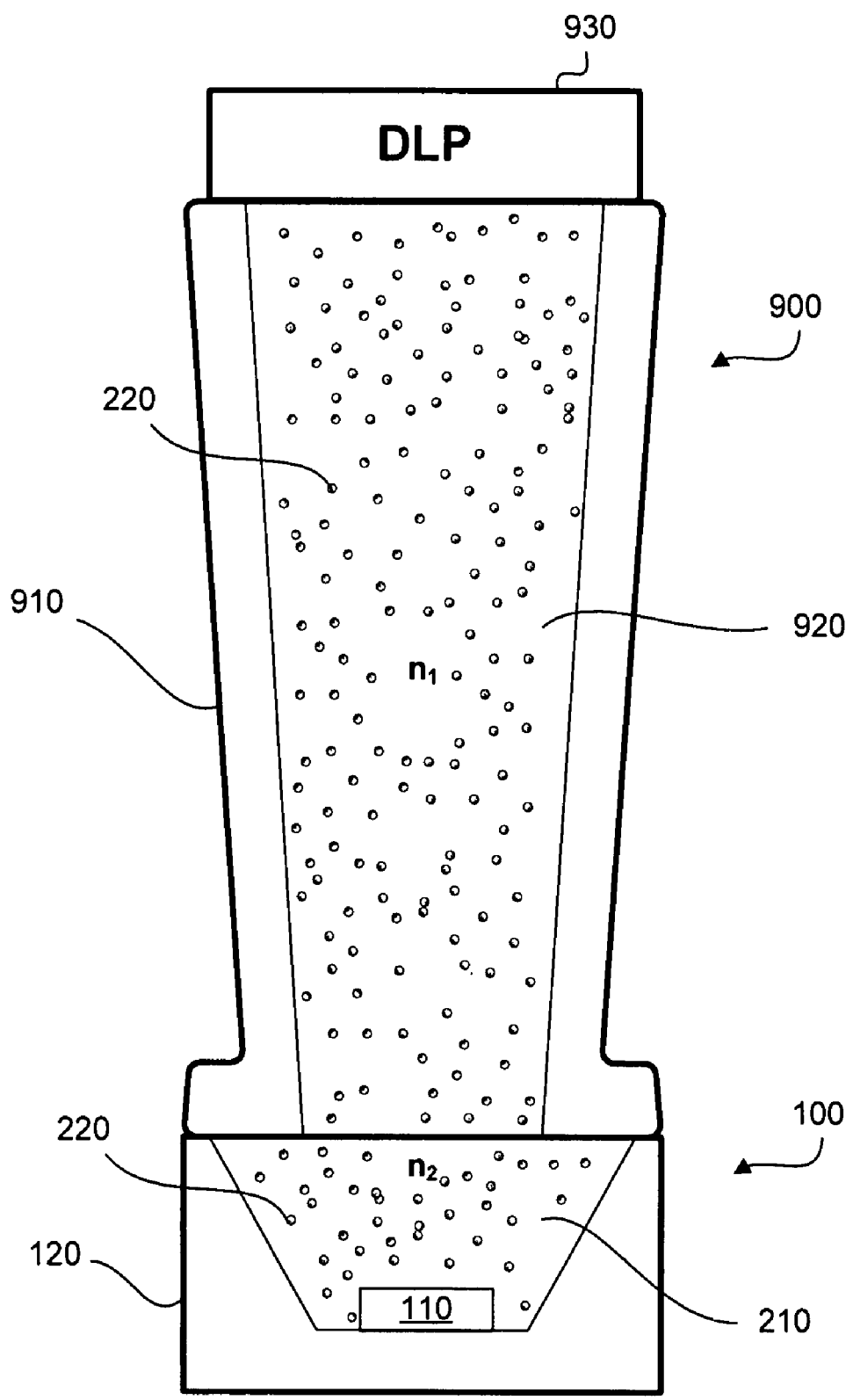
FIG. 9 illustrates a light tube for coupling light from a light-emitting device to a digital light processor (DLP).

FIG. 9 illustrates a light tube 900 for coupling light from the light-emitting device 100 to a digital light processor (DLP) 930. The light tube 900, also referred to as a light pipe, includes a body 910 and a matrix material 920. The light emitted from the light-emitting device 100 can be coupled to the DLP 930 via the matrix material 920 of the light tube 900. Beads 220, for example glass beads, can be dispersed in the matrix material 920 of the light tube 900 to increase the luminance and color uniformity of the light transmitted to the DLP 930 from the light-emitting device 100. In various embodiments, the matrix material 920 includes, for example, glass, silicone, polymer, epoxy, and plastic, having a refractive index of $n_1$. The matrix material 210 of the light-emitting device 100 has a refractive index of $n_2$. Generally, the refractive index n, of the matrix material 920 is about equal to the refractive index $n_2$ of the light-emitting device 100 to improve efficiency of light collection from the light source 110. Beads 220 can also be dispersed in the matrix material 210 of the light-emitting device 100 to increase the luminance and color uniformity of the emitted light.

While the light-emitting device 100 illustrated in FIG. 9 depicts a matrix material 210 having one layer, a person of ordinary skill in the art will appreciate that the light-emitting device 100 can include multiple layers of matrix material and beads 220 can be dispersed in any or all of the layers. For example, the light-emitting device 100 can include three layers as in the light-emitting device 400 (FIG. 4), and all three layers can include glass beads 220 dispersed in a silicone matrix material of varying indices of refraction. The silicone matrix material of the layer adjacent the light tube 900 can have a refractive index $n_2$ equal to the refractive index $n_1$ of the matrix material 920.

Figure 10:
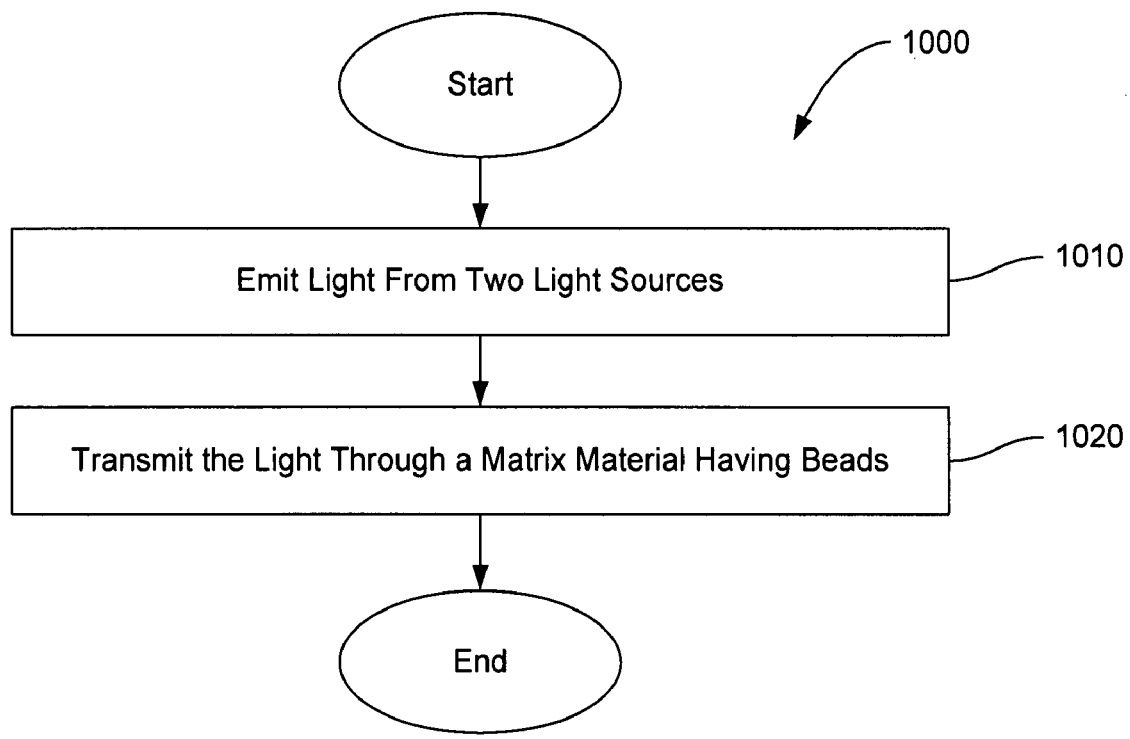
FIG. 10 depicts a method according to an exemplary embodiment of the invention.

FIG. 10 depicts a method 1000 according to an exemplary embodiment of the invention. Method 1000 comprises a step 1010 of emitting light from two light sources disposed on a support, and a step 1020 of transmitting the light through a matrix material having a first refractive index and beads having a second, different, refractive index dispersed within the matrix material.

In the foregoing specification, the present invention is described with reference to specific embodiments thereof, but those skilled in the art will recognize that the present disclosure is not limited thereto. Various features and aspects of the above-described invention may be used individually or jointly. Further, the present invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art. It will be further recognized the "LED" and "LED die" are used interchangeably herein.

What is claimed is:

1. A light-emitting device comprising:
   a body configured to support a light source, the body comprising:
   a top surface, and
   a cavity extending downward from the top surface, the cavity having a floor configured to receive a light source;
   a light source bonded to the floor; and
   a plurality of layers disposed between the light source and the top surface, the plurality of layers including:
   a first layer adjacent to the light source, the first layer having a first refractive index, the first layer including a thermal insulating material, and
   a second layer between the first layer including the thermal insulating layer and the top surface, the second layer having a second refractive index and including:
   a matrix material; and
   a dispersion of beads within the matrix material, the beads configured to scatter light provided by the light source, and
   wherein the second refractive index is different than the first refractive index.

2. The light-emitting device of claim 1, wherein the floor is fabricated from a material having a thermal conductivity greater than 150 watts/meter-Kelvin.

3. The light-emitting device of claim 1, wherein the light source comprises red, green, and blue light-emitting elements, and the beads and first layer are transparent to the light emitted by the light emitting elements.

4. The light-emitting device of claim 1, wherein the light source comprises a blue light-emitting element, a red light-emitting element and two green light-emitting elements, and the beads are transparent to red, green, and blue light.

5. The light-emitting device of claim 1, wherein the floor is fabricated from aluminum nitride.

6. The light-emitting device of claim 1, wherein the matrix material includes a first glass, and the beads include a second glass having a higher melting point than the first glass.

7. The light-emitting device of claim 1, wherein at least a portion of the matrix includes a phosphor that absorbs light emitted by the light source, and the beads are transparent to the light emitted by both the light source and the phosphor.

8. The light-emitting device of claim 1, wherein the cavity includes a parabolic reflective surface.

9. The light-emitting device of claim 1, wherein the matrix material is disposed as a convex lens above the cavity and having a radius of curvature that does not exceed a cavity radius associated with the cavity.

10. The light-emitting device of claim 1, wherein the thermal insulating material has a thermal conductivity below 0.5 watts/meter-Kelvin.

11. The light-emitting device of claim 1, wherein the thermal insulating layer includes a polyimide.

12. The light-emitting device of claim 1, wherein the thermal insulating material has a glass transition temperature above 170 degrees Celsius .

13. The light-emitting device of claim 1, wherein the first refractive index is greater than a refractive index of the second layer.

14. The light-emitting device of claim 1, wherein the first refractive index is greater than 1.6.

15. The light-emitting device of claim 1, wherein the second refractive index is greater than about 1.44 and less than about 1.60.

16. The light-emitting device of claim 1, wherein the first refractive index is between 1.65 and 1.84.

17. The light-emitting device of claim 1, wherein the beads include silicone beads.

18. The light-emitting device of claim 1, wherein the light source is bonded to the floor with a die attach layer having a thermal conductivity greater than 0.5 watts/meter-Kelvin.

19. The light-emitting device of claim 1, wherein a diameter of the beads is greater than about 0.5 microns and less than about 10 microns, and an amount of beads dispersed within the matrix is between 2 and 10 percent by weight.

20. The light-emitting device of claim 1, wherein an amount of beads within the matrix material is greater than about 2 percent and less than about 10 percent by weight.

21. The light-emitting device of claim 1, wherein the plurality of layers includes a third layer attached to the second layer and opposite the first layer, the third layer having a lower refractive index than the second.

22. The light-emitting device of claim 21, wherein the first refractive index is 1.55, the second layer has a refractive index of 1.5, and the third layer has a refractive index of 1.45.

23. The light-emitting device of claim 21, wherein the third layer includes an adhesive layer, and the device further comprises a lens attached to the adhesive layer.

24. The light-emitting device of claim 23, wherein the body includes a socket configured to receive the lens, and the lens is inserted into the socket.

25. The light-emitting device of claim 23, wherein lens includes a Fresnel lens.

26. The light-emitting device of claim 23, wherein the adhesive layer includes silicone.

* * * * *